(12) United States Patent
Baldo et al.

(10) Patent No.: US 11,362,293 B2
(45) Date of Patent: Jun. 14, 2022

(54) INTERLAYERS AND ASSOCIATED SYSTEMS, DEVICES, AND METHODS

(71) Applicant: Massachusetts Institute of Technology, Cambridge, MA (US)

(72) Inventors: Marc A. Baldo, Lexington, MA (US); Tony Wu, Boston, MA (US); Markus Einzinger, Brighton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 42 days.

(21) Appl. No.: 16/427,192

(22) Filed: May 30, 2019

(65) Prior Publication Data
US 2019/0372038 A1    Dec. 5, 2019

Related U.S. Application Data

(60) Provisional application No. 62/678,818, filed on May 31, 2018.

(51) Int. Cl.
*H01L 51/42* (2006.01)
*H01L 51/00* (2006.01)
(Continued)

(52) U.S. Cl.
CPC .... *H01L 51/422* (2013.01); *H01L 31/022441* (2013.01); *H01L 31/055* (2013.01);
(Continued)

(58) Field of Classification Search
CPC ............. H01L 51/0052; H01L 51/0054; H01L 51/4213; H01L 51/422; H01L 51/441;
(Continued)

(56) References Cited

U.S. PATENT DOCUMENTS

2003/0219632 A1* 11/2003 Schaepkens .......... C23C 16/345
428/698
2005/0217722 A1* 10/2005 Komatsu ................ B82Y 10/00
136/263
(Continued)

FOREIGN PATENT DOCUMENTS

CN        104134546 A      11/2014
WO    WO-2016199118 A1 *  12/2016    ........... H01G 9/2027

OTHER PUBLICATIONS

Chung et al., Hafnium nitride for hot carrier solar cells. Solar Energy Mat Solar Cells. 2014;144:781-786.
(Continued)

*Primary Examiner* — Lindsey A Bernier
(74) *Attorney, Agent, or Firm* — Wolf, Greenfield & Sacks, P.C.

(57) ABSTRACT

Embodiments related to interlayers (e.g., interlayers comprising a transition metal oxide, a transition metal oxynitride, and/or a transition metal nitride) and associated systems, devices (e.g., photovoltaic devices), and methods are disclosed. In some embodiments, a system for exciton transfer includes a substrate including an inorganic semiconductor. An interlayer may be disposed on the substrate, and a layer including a material that undergoes singlet exciton fission when exposed to electromagnetic radiation may be disposed on the interlayer. The interlayer may be disposed between the substrate and the layer. In some embodiments, a method for manufacturing a system for exciton transfer involves depositing an interlayer onto a substrate that includes an inorganic semiconductor. The method may also include depositing a layer including a material that undergoes singlet exciton fission when exposed to electromagnetic radiation onto the interlayer.

36 Claims, 12 Drawing Sheets

(51) Int. Cl.
   *H01L 51/44* (2006.01)
   *H01L 31/0224* (2006.01)
   *H01L 31/055* (2014.01)

(52) U.S. Cl.
   CPC ........ *H01L 51/001* (2013.01); *H01L 51/0052* (2013.01); *H01L 51/0054* (2013.01); *H01L 51/4213* (2013.01); *H01L 51/441* (2013.01); *H01L 51/445* (2013.01); *H01L 51/448* (2013.01)

(58) Field of Classification Search
   CPC ........... H01L 51/445; H01L 31/022441; H01L 31/055
   See application file for complete search history.

(56) References Cited

U.S. PATENT DOCUMENTS

| | | | |
|---|---|---|---|
| 2008/0241421 A1* | 10/2008 | Chen | H01L 31/0216 427/576 |
| 2009/0050201 A1 | 2/2009 | Fortmann | |
| 2016/0238455 A1 | 8/2016 | Congreve et al. | |

OTHER PUBLICATIONS

Einzinger et al., Sensitization of Silicon by Singlet Exciton Fission. MIT. ISPF2 Gothenburg, Sweden. Apr. 19, 2018. 32 pages.
Einzinger et al., Sensitization of Silicon by Singlet Excition Fission. Powerpoint presentation. ISPF$^2$. Gothenburg, Sweden. Apr. 20, 2018.

* cited by examiner

INTERLAYERS AND ASSOCIATED SYSTEMS, DEVICES, AND METHODS

CROSS-REFERENCE TO RELATED APPLICATIONS

This application claims the benefit under 35 U.S.C. § 119(e) of U.S. application Ser. No. 62/678,818, filed May 31, 2018, the disclosure of which is incorporated by reference in its entirety.

GOVERNMENT SUPPORT

This invention was made with Government support under Grant No. DE-SC0001088 awarded by the Department of Energy (DOE). The Government has certain rights in the invention.

FIELD

Embodiments related to interlayers and associated systems, devices, and methods are disclosed.

BACKGROUND

Since 2007, the cumulative installed capacity of solar photovoltaics has experienced exponential growth. Among a multitude of technologies, solar cells based on silicon are by far the most widely used, fueled by remarkable reductions in cost and advances in efficiencies. But with impressive power conversion efficiencies of up to 26.3% already reported, silicon solar cells are approaching their thermodynamic limit of 29.1%, a barrier that would be advantageous to overcome to maintain current trends relating to the balance of system costs and reductions in cost per Watt.

Fundamental limits of solar cells were first described by Shockley and Queisser in 1961. For example, photons with energies above the bandgap are absorbed by some cells, but during thermalization to the band edge their excess energy is lost. In other words, in some cells, even photons with twice the energy of the bandgap create a single electron-hole pair. This leads to a suboptimal harvesting of the solar spectrum.

SUMMARY

In one aspect, a system for exciton transfer includes a substrate comprising an inorganic semiconductor. The system may have transition metal oxide, a transition metal oxynitride, and/or a transition metal nitride interlayer disposed on the substrate. The system may have a layer disposed on the transition metal oxide, transition metal oxynitride, and/or transition metal nitride interlayer. In some embodiments, the layer comprises a material that undergoes singlet exciton fission when exposed to electromagnetic radiation. In some embodiments, the interlayer is disposed between the substrate and the layer.

In one aspect, a system for exciton transfer includes a substrate comprising an inorganic semiconductor. The system may have an interlayer comprising a transition metal oxide and/or a transition metal oxynitride disposed on the substrate. The system may have a layer disposed on the interlayer. In some embodiments, the layer comprises a material that undergoes singlet exciton fission when exposed to electromagnetic radiation. In some embodiments, the interlayer is disposed between the substrate and the layer.

In another aspect, a method for manufacturing a system for exciton transfer includes depositing a transition metal oxide, a transition metal oxynitride, and/or a transition metal nitride interlayer onto a substrate comprising an inorganic semiconductor. The method may involve depositing a layer onto the transition metal oxide, transition metal oxynitride, and/or transition metal nitride interlayer. In some embodiments, the layer comprises a material that undergoes singlet exciton fission when exposed to electromagnetic radiation. In some embodiments, the interlayer is disposed between the substrate and the layer.

In another aspect, a method for manufacturing a system for exciton transfer includes depositing an interlayer comprising a transition metal oxide and/or a transition metal oxynitride onto a substrate comprising an inorganic semiconductor. The method may involve depositing a layer onto the interlayer. In some embodiments, the layer comprises a material that undergoes singlet exciton fission when exposed to electromagnetic radiation. In some embodiments, the interlayer is disposed between the substrate and the layer.

It should be appreciated that the foregoing concepts, and additional concepts discussed below, may be arranged in any suitable combination, as the present disclosure is not limited in this respect. Further, other advantages and novel features of the present disclosure will become apparent from the following detailed description of various non-limiting embodiments when considered in conjunction with the accompanying figures.

BRIEF DESCRIPTION OF THE DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings.

DETAILED DESCRIPTION

Figure 1:
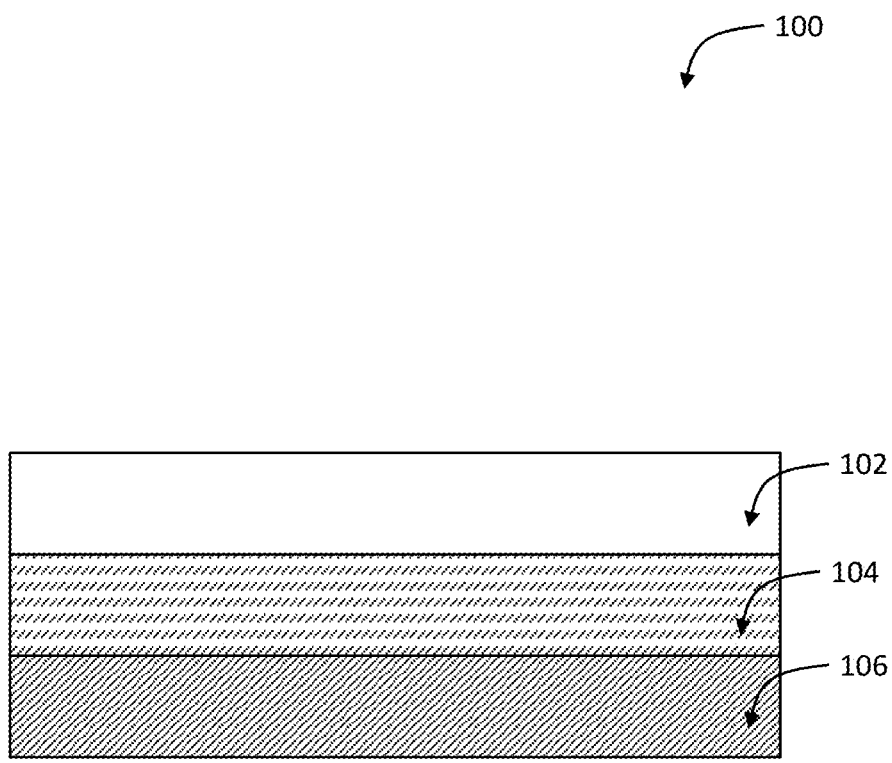
FIG. 1 is a cross-sectional schematic view 100 of a system comprising an interlayer 104, according to some illustrative embodiments.

Embodiments related to interlayers (e.g., interlayers comprising a transition metal and nitrogen, a transition metal oxide, a transition metal oxynitride, and/or a transition metal nitride) and associated systems, devices (e.g., photovoltaic devices), and methods are disclosed.

There are several approaches to circumventing the Shockley-Queisser limit. For example, multi-junction solar cells combine several materials with different bandgaps for a more efficient harvesting of the spectrum. In fact, certain four-junction cells illuminated by concentrated sunlight may directly convert sunlight into electricity at e.g. 46% power conversion efficiency. Multi-junction cells, however, are more expensive to produce and may only be cost-effective in space applications. Another potential approach is carrier multiplication. In carrier multiplication, absorption of one high energy photon leads to creation of more than one electron-hole pair (also referred to herein as an exciton). Implementations of this down-conversion scheme could be realized using e.g., lanthanides, quantum dots, or single walled carbon nanotubes, or a combination thereof, at least some of which exhibit this phenomenon.

A particularly efficient way to generate two or more excited states per absorbed photon is singlet exciton fission. Singlet exciton fission (also referred to herein as singlet fission) occurs in some materials (e.g., some aggregates of organic molecules, e.g., tetracene) in which a singlet exciton energy is equal to roughly double a triplet exciton energy of the material. Singlet exciton fission can occur on sub-100 fs (femtosecond) timescales with yields of up to 200%. A distinct advantage of singlet exciton fission is that major potential loss for a down-conversion process is spin-forbidden: a singlet exciton cannot convert to one triplet exciton. It may be that only conversion of a singlet exciton into two triplet excitons (also referred to herein as triplets) via a correlated triplet-triplet pair state is spin-allowed. Indeed, this process may be employed in organic photovoltaics (OPV), where internal and external quantum efficiencies in excess of 100% may be achieved. But singlet exciton fission may also cut the maximum achievable open circuit voltage in half, so that in isolation, photoconversion efficiency gain may not be realized. In order to boost power efficiencies, singlet fission materials may be associated with low bandgap inorganic semiconductors including, for example, silicon.

In view of the above, the Inventors have recognized that it may be desirable to include a material capable of mediating energy transfer between a material that may undergo singlet fission and an associated inorganic semiconductor. Further, in some embodiments, it may also be desirable to provide a charge-separated state between the material that undergoes singlet fission and the inorganic semiconductor. Accordingly, the Inventors have recognized the benefits associated with the use of an interlayer (e.g., relating to electric field passivation) disposed between the semiconductor substrate and a material layer capable of undergoing singlet fission. For example, the interlayer may have an appropriate energy level between a triplet exciton energy of the singlet fission material and the inorganic semiconductor bandgap. Specifically, in some embodiments described herein, an appropriate interlayer material may include materials comprising a transition metal and one or both of nitrogen and oxygen such as transition metal nitrides, transition metal oxides, transition metal oxynitrides, and/or combinations of the foregoing. Accordingly, a system for exciton transfer may include a substrate comprising an inorganic semiconductor; an interlayer comprising a transition metal oxide, a transition metal oxynitride, and/or a transition metal nitride disposed on the substrate; and a layer disposed on the interlayer. The layer disposed on the interlayer may comprise a material that undergoes singlet exciton fission when exposed to electromagnetic radiation. Further, the interlayer may be disposed between the substrate and the layer.

While an interlayer is described as being between a substrate and a singlet fission layer, it should be understood that the interlayer may either be disposed directly and/or indirectly between these layers as the disclosure is not so limited. For example, in some embodiments one or more other materials layers may be located between the interlayer and the substrate and/or between the interlayer and the singlet fission layer. Additionally, depending on the embodiment, an interlayer may be positioned proximate to these one or more other material layers such that it is positioned close enough and/or is otherwise connected with the one or more other materials such that exciton transfer may occur between the substrate and singlet fission layer through the interlayer.

In addition to the above, the Inventors have recognized that it may be advantageous for an inorganic semiconductor (e.g., silicon) to have a bandgap that closely matches a triplet exciton energy produced by a material that undergoes singlet exciton fission when exposed to electromagnetic radiation. For example, in some embodiments, an inorganic semiconductor bandgap is within 0.25 eV, within 0.20 eV, within 0.15 eV, within 0.10 eV, or within 0.05 eV of a triplet exciton energy associated with an exciton produced by singlet exciton fission in a material associated with the inorganic semiconductor. In some embodiments, an inorganic semiconductor bandgap is at least 0.01 eV, at least 0.02 eV, at least 0.03 eV, or at least 0.04 eV different from a triplet exciton energy associated with an exciton produced by singlet exciton fission in a material associated with the inorganic semiconductor. Combinations of the above-referenced ranges are also possible (e.g., between or equal to 0.01 eV and 0.3 eV difference between an inorganic semiconductor bandgap and material triplet exciton energy). Of course it should be understood that other ranges both larger and smaller than those noted above are also possible.

Previous experiments with materials (e.g., tetracene) that undergo singlet exciton fission when exposed to electromagnetic radiation, associated with inorganic semiconductors (e.g., hydrogen-passivated silicon) by an interlayer (e.g., lithium fluoride interlayers) disposed between the material and the inorganic semiconductor have shown the presence of singlet transfer, but yielded no evidence of triplet exciton transfer. One reason for this lack of triplet transfer may be the lack of a suitable interlayer. Accordingly, an interlayer may be bifunctional: it may allow transfer of charge carriers or excitons, and it may also provide sufficient passivation to prevent rapid recombination of charge carriers at the inorganic semiconductor (e.g., silicon) interface. Passivation may be separated into two components: chemical passivation and field-effect passivation. Chemical passivation may involve a reduction in recombination centers by saturating dangling bonds at a surface, while field-effect passivation may result from repulsion of charge carriers in response to an electric field present at a surface. Generally, passivation interlayers may rely on contributions from both approaches.

Generally, a passivating interlayer may not be conductive, since this would lead to rapid recombination of charge carriers. Therefore, a passivating interlayer may generally be a dielectric material. In order for charge carriers to tunnel, an interlayer may have a suitable thickness to permit tunneling to occur for a desired operation since tunneling probability decreases exponentially with barrier width (e.g., interlayer thickness). Further, the bandgap of an interlayer may also be controlled to be sufficiently small since tunneling probability also decreases exponentially with the square root of barrier height (e.g., interlayer bandgap). In some embodiments, an interlayer comprises one or more transition metals, one or more metalloids, and/or one or more post-transition metals combined with one, or both of, nitrogen and oxygen as well as any appropriate combination of the foregoing. Exemplary classes of materials, at least some of which may function as an interlayer as discussed herein, may include transition metal oxides, transition metal oxynitrides, transition metal nitrides, post-transition metal oxides, post-transition metal oxynitrides, post-transition metal nitrides, metalloid oxides, metalloid oxynitrides, and metalloid nitrides. Transition metal nitrides may comprise (e.g. consist essentially of) one or more transition metals and nitrogen. Transition metal oxides may comprise (e.g., consist essentially of) one or more transition metals and oxygen. Transition metal oxynitrides may comprise (e.g., consist essentially of) one or more transition metals, oxygen, and nitrogen. Transition metals are found in Groups 3-12 of the Periodic Table. Post-transition metals are found within Groups 13-16 of the Periodic Table. Metalloids are found within Groups 13-17 of the Periodic Table. Non-limiting examples of transition metal oxides include hafnium oxide, tungsten oxide, and zirconium oxide. Non-limiting examples of transition metal oxynitrides include hafnium oxynitride, tungsten oxynitride, and zirconium oxynitride. Non-limiting examples of transition metal nitrides include hafnium nitride, tungsten nitride, and zirconium nitride. A non-limiting example of a metalloid nitride is silicon nitride.

In one specific embodiment, an interlayer may be a transition metal nitride interlayer. One exemplary transition metal nitride that fulfills many interlayer properties discussed herein is hafnium nitride ($Hf_3N_4$). In some embodiments, hafnium nitride has the chemical formula $Hf_3N_4$. Although other stoichiometric ratios between hafnium and nitrogen may exist, as referred to herein, hafnium nitride refers to $Hf_3N_4$.

In another specific embodiment, an interlayer may be a transition metal oxide interlayer. One exemplary transition metal oxide that fulfills many interlayer properties discussed herein is hafnium oxide. In some embodiments, hafnium oxide may have the chemical formula $HfO_2$.

In another specific embodiment, an interlayer may be a transition metal oxynitride interlayer. One exemplary transition metal oxynitride that fulfills many interlayer properties discussed herein is hafnium oxynitride ($HfO_xN_y$). The atomic concentrations of the elements for an interlayer comprising a transition metal oxynitride (e.g., a transition metal oxynitride interlayer) may be between or equal to 40 atomic % and 70 atomic % transition metal, 50 atomic % and 60 atomic % transition metal, and/or about 57 atomic % transition metal The transition metal oxynitride may also include between or equal to 1 atomic % and 60 atomic % nitrogen, 15 atomic % and 60 atomic % nitrogen, 20 atomic % and 30 atomic % nitrogen, and/or ab out 22 atomic % nitrogen. The transition metal oxynitride may additionally include between or equal to 1 atomic % and 60 atomic % oxygen, 15 atomic % and 60 atomic % oxygen, 20 atomic % and 30 atomic % oxygen, and/or about 21 atomic % oxygen. Combinations of the above-referenced ranges are also possible. Further, other ranges of the above noted compositions both greater and less than the ranges noted above are also contemplated.

Regardless of the specific material used to form an interlayer, in some embodiments, an interlayer may be insulating. Further the interlayer may be grown or otherwise deposited onto a substrate in any appropriate manner. In one specific embodiment, an interlayer may be grown on a semiconducting substrate by atomic layer deposition (ALD).

As noted above, a suitable bandgap of an interlayer may be controlled to permit charge carrier tunneling since tunneling probability decreases exponentially with the square root of barrier height (e.g., interlayer bandgap). Further, the interlayer material may also be an electrically insulating material to reduce or prevent recombination. In some embodiments, the bandgap of the interlayer is at most 10 eV, at most 9 eV, at most 8 eV, at most 7 eV, at most 6 eV, at most 5 eV, at most 4.3 eV, at most 4 eV, at most 3 eV, at most 2.5 eV, at most 2.4 eV, at most 2.3 eV, at most 2.2 eV, at most 2.1 eV, at most 2.0 eV, at most 1.9 eV, or at most 1.8 eV. In some embodiments, the bandgap of the interlayer is at least 1.1 eV, at least 1.2 eV, at least 1.3 eV, at least 1.4 eV, at least 1.5 eV, at least 1.6 eV, or at least 1.7 eV. Combinations of the above-referenced ranges are also possible (e.g., at least 1.1 eV and at most 10 eV, at least 1.1 eV and at most 5 eV, at least 1.1 eV and at most 2.5 eV). Other ranges are also possible. As a non-limiting example, a bandgap of hafnium nitride has been determined to be about 1.8 eV by synchrotron-based measurements of soft X-ray spectra (SXS), and a dielectric constant of hafnium nitride is estimated to be approximately 30, which should assist its ability to store charge at a silicon interface in some embodiments. As another non-limiting example, a bandgap of hafnium oxynitride has been determined to be about 4.3 eV by ultraviolet photoelectron spectroscopy (UPS) and inverse photoemission spectroscopy (IPES).

Defects in an interlayer deposited onto a semiconducting substrate may disrupt the desired properties of the layer. Accordingly, in some embodiments, the interlayer may be amorphous or single-crystalline. In some embodiments, the interlayer may advantageously be substantially continuous without defects.

As noted above, since tunneling probability decreases exponentially with barrier width (e.g., interlayer thickness), in some embodiments, a thickness of an interlayer may be precisely controlled. In order to achieve atomic precision of interlayer thickness, in some embodiments, a method of manufacturing a system for exciton transfer includes depositing an interlayer using atomic layer deposition (ALD) of interlayer precursors or other appropriate deposition method. For example, in some embodiments, a method of manufacturing a system for exciton transfer includes depositing an interlayer (such as an interlayer comprising a transition metal oxide, a transition metal oxynitride, and/or a transition metal nitride interlayer) using atomic layer deposition (ALD) of appropriate precursors, e.g., in an alternating process, e.g., with between or equal to 1 and 10 cycles of alternating precursors. In one such embodiment, alternating cycles of a metal organic hafnium precursor may be deposited with a dimethyl ammonia nitrogen precursor for about 5 cycles. Regardless of the deposition method, to facilitate tunneling, in some cases, the interlayer may have a thickness of between or equal to 1 Angstrom and 15 Angstroms, 6 Angstroms and 10 Angstroms, 7 Angstroms and 9 Angstroms, or any other appropriate thickness depending on the particular materials.

In some embodiments, an inorganic semiconductor may be used in the systems and devices disclosed herein. Depending on the embodiment, the inorganic semiconductor may be a n-doped semiconductor. Further, in some cases, the inorganic semiconductor is silicon though other inorganic semiconductors may also be used as is known in the art. As noted above, in some embodiments, a silicon substrate may be used in combination with a material that undergoes singlet exciton fission and an interlayer material as described herein. In certain cases, the inorganic semiconductor is n-doped silicon. In some embodiments, in n-doped silicon, the Fermi level is close to the conduction band of the silicon. In some embodiments, at equilibrium, n-doping of silicon may bring the conduction band of silicon closer to the highest occupied molecular orbital (HOMO) energy of a material that undergoes singlet exciton fission such as tetracene (an example of a material that undergoes singlet fission upon exposure to electromagnetic radiation), which may advantageously result in a lower energy charge-separated state across an interlayer material such as a hafnium nitride, hafnium oxide, and/or hafnium oxynitride interlayer (e.g., FIG. 5c). As used herein, the term across may refer to spanning the thickness of a component, layer, and/or substrate and may include a region in the direct vicinity of either side of the thickness of the component. Of course, while a specific inorganic semiconductor corresponding to silicon has been mentioned above, it should be understood that semiconducting materials other than silicon are also contemplated.

In some embodiments, a material that undergoes singlet fission when exposed to electromagnetic radiation may include a dye or chromophore that has a conjugated system and a specific energetic structure which permits singlet fission to occur as well as appropriate energy properties to permit coupling with the corresponding inorganic semiconductor the material layer is associated with. Non-limiting examples of materials that undergo singlet exciton fission (also referred to herein as singlet fission) when exposed to electromagnetic radiation may include tetracene, tretracene derivatives (e.g. rubrene (5,6,11,12-tetraphenyltetracene)), anthracene, anthracene derivatives (e.g. dicyanoanthracene and 9,10-dichlorooctafluoroanthracene), a combination of the foregoing, and/or any other appropriate material capable of undergoing singlet fission with appropriate energies for coupling with an associated semiconducting material. These materials listed above may be characterized as polycyclic aromatic hydrocarbons (PAHs) which may further be characterized as polyacenes or polyacene derivatives. Further, and without wishing to be bound by theory, these specific materials have the appropriate energetic structures that are well suited for coupling to silicon in a photovoltaic device. The disclosed materials may be deposited onto an interlayer using any appropriate deposition method including, for example, a thermal evaporation process as detailed further below. Further, these material layers may have any appropriate thickness for use in a photovoltaic device. For example, in one embodiment, a thickness of the layer may be greater than or equal to 10 nm, 30 nm, 50 nm, 100, nm, 200 nm, and/or any other appropriate thickness. Further, the thickness of the singlet fission layer may be less than or equal to 300 nm, 200 nm, 100 nm, and/or any other appropriate thickness. Combinations of the above ranges are contemplated including for example a layer with a thickness between or equal to 10 nm and 300 nm. Of course embodiments in which different combinations and/or ranges both greater and less than those noted above are also contemplated as the disclosure is not so limited.

In some exemplary embodiments, the Inventors chose a system silicon/$Hf_3N_4$/tetracene, in which hafnium nitride was grown by atomic layer deposition and tetracene was thermally evaporated. Of course embodiments in which the interlayer disposed between the silicon and tetracene comprises hafnium oxide and/or hafnium oxynitride are also contemplated. As a non-limiting example, high-performing thicknesses of hafnium nitride, hafnium oxide, and/or hafnium oxynitride interlayers in a silicon/interlayer/tetracene system were found to be between or equal to 0.6 nm and 1.0 nm (e.g., about 0.8 nm), as discussed further herein. In some embodiments, tetracene thickness in a silicon/interlayer/tetracene system may be about 30 nm.

In some embodiments, since tunneling probability decreases exponentially with barrier width (e.g., including inorganic semiconductor surface oxide layer thickness), a method for manufacturing a system for exciton transfer may include removing an oxide layer (e.g., a native oxide layer) from a substrate (e.g., comprising an inorganic semiconductor, e.g., silicon). Removing an oxide layer may include exposing a substrate to hydrofluoric acid and/or following a standard or modified RCA cleaning protocol, as described further elsewhere herein.

While a particular example is detailed above, it should be understood that inorganic semiconductors other than silicon, interlayers other than hafnium oxynitride, hafnium oxide, and/or hafnium nitride, as well as materials that undergo singlet fission upon exposure to electromagnetic radiation other than tetracene, may be used, and that the disclosure is not limited to only the specific material combinations described herein.

Among many available singlet fission active molecules, in some embodiments, tetracene was chosen as a material for a layer that undergoes singlet fission and silicon was chosen for the inorganic semiconductor, at least because tetracene is readily evaporable, and its triplet exciton energy (1.25 eV) closely matches the bandgap of silicon (1.11 eV).

For purposes of this disclosure, the chemical elements are identified in accordance with the Periodic Table of the Elements, CAS version, *Handbook of Chemistry and Phys-* ics, 75th Ed., inside cover, and specific functional groups are generally defined as described therein. Additionally, general principles of organic chemistry, as well as specific functional moieties and reactivity, are described in *Organic Chemistry*, Thomas Sorrell, University Science Books, Sausalito: 1999, the entire contents of which are incorporated herein by reference.

In some embodiments, a method for manufacturing a system for exciton transfer comprises depositing an interlayer (e.g., an interlayer comprising a transition metal oxide, a transition metal oxynitride, and/or a transition metal nitride) onto a substrate (e.g., comprising an inorganic semiconductor). In some embodiments, the substrate may be a cleaned substrate and the material may be deposited using any appropriate deposition technique including, for example, atomic layer deposition (ALD). In some embodiments, the method further comprises drying the deposited interlayer. In some embodiments, drying the deposited interlayer may remove water and other evaporable contaminants. In some embodiments, drying involves exposing the deposited interlayer to vacuum, e.g., to a pressure of $10^{-6}$ Torr or less. In some embodiments, drying involves exposing the deposited interlayer to an elevated temperature less than or equal to the temperature for atomic layer deposition of an interlayer in the system, e.g., not exceeding 150 degrees Celsius.

In some embodiments, a method for manufacturing a system for exciton transfer comprises depositing a layer onto an interlayer (e.g., an interlayer comprising a transition metal oxide, a transition metal oxynitride, and/or a transition metal nitride). In some embodiments, the layer comprises a material that undergoes singlet exciton fission when exposed to electromagnetic radiation. In some embodiments, the interlayer is disposed between the substrate and the layer. In some embodiments, depositing the layer comprises thermal evaporation of the material. For example, thermal evaporation of tetracene may involve exposing tetracene to a temperature of between or equal to 80 degrees Celsius and 150 degrees Celsius, wherein tetracene sublimes upon exposure to these temperatures. In some embodiments, thermal evaporation involves rotating the substrate during thermal evaporation, e.g., at 1 rotation/second. In some embodiments, the layer has a thickness of between or equal to 5 nm and 1 micron (e.g., 5 nm and 200 nm).

Since some of the materials disclosed herein are sensitive to the presence of water and/or oxygen, it may be desirable in some embodiments, to isolate the disclosed systems from a surrounding environment. In such an embodiment, a method for manufacturing a system for exciton transfer may include enclosing the system using an appropriate encapsulant, and in some instances a separate supporting substrate, to form a barrier between the system and an environment external to the system. In some cases, the encapsulant may comprise a cross-linked polymer (e.g., epoxy) and/or a glass or quartz layer may be placed adjacent to one or more surfaces of the disclosed devices. In some embodiments, enclosing the system may prevent contact of air, water, and/or other contaminants from the external environment into the system.

Turning now to the figures, several non-limiting embodiments are described in further detail. However, it should be understood that the current disclosure is not limited to only those specific embodiments described herein. Instead, the various disclosed components, features, and methods may be arranged in any suitable combination as the disclosure is not so limited.

FIG. 1 is a cross-sectional schematic view of a system 100 comprising an interlayer 104, according to some illustrative embodiments. In some embodiments, a system for exciton transfer comprises: a substrate 106 (e.g., a substrate comprising an inorganic semiconductor, e.g., silicon); an interlayer 104 (e.g., an interlayer comprising a transition metal oxide, a transition metal oxynitride, and/or a transition metal nitride) disposed on the substrate 106; and a layer 102 disposed on the interlayer 104. The layer 102 may comprise a material (e.g., tetracene) that undergoes singlet fission when exposed to electromagnetic radiation. Further, the interlayer 104 may be disposed between the substrate 106 and the layer 102.

Figure 2:
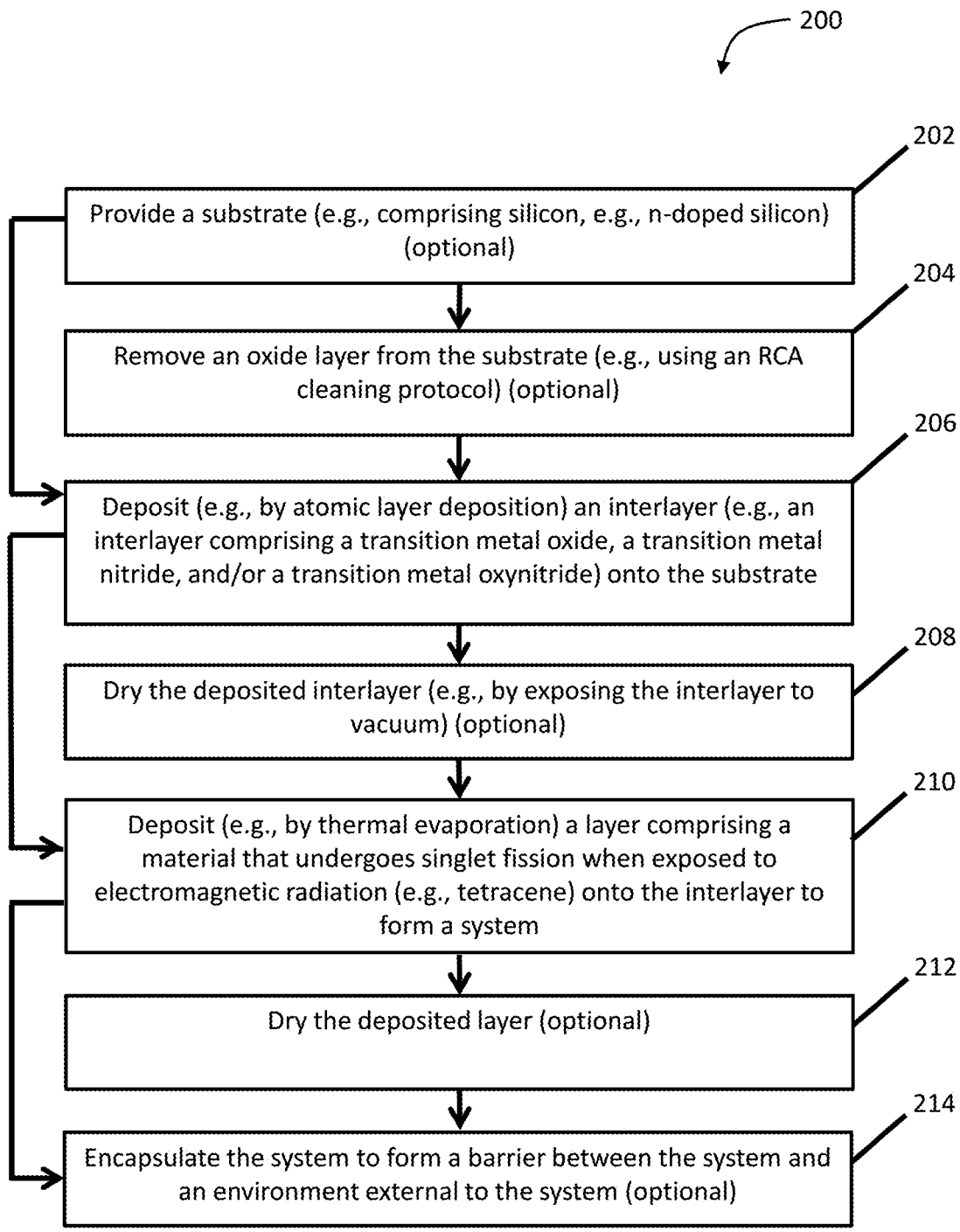
FIG. 2 is a flowchart 200 illustrating methods for manufacturing a system comprising an interlayer, according to certain embodiments.

FIG. 2 is a flowchart 200 illustrating methods for manufacturing a system comprising an interlayer, according to certain embodiments. Non-limiting illustrative methods for manufacturing a system for exciton transfer are provided in FIG. 2. At 202, an inorganic semiconducting substrate may be provided. In some instances the substrate may be cleaned to remove an oxide layer or other contaminants at 204. At step 206 an interlayer comprising a transition metal oxide, a transition metal oxynitride, and/or a transition metal nitride interlayer is deposited (e.g., by atomic layer deposition) onto the substrate. In some instances, it may be advantageous to dry the deposited interlayer at 208. Again, this may be done by exposing the assembly to a vacuum and/or elevated temperatures below or equal to the deposition temperature of the interlayer material. At step 210, a layer comprising a material (e.g., tetracene) that undergoes singlet fission when exposed to electromagnetic radiation may be deposited onto the interlayer. In some instances the assembly may again be dried after depositing the singlet fission layer at 212. In some embodiments, the interlayer is disposed between the substrate and the layer. As noted above, in some instances the assembly may be encapsulated using any appropriate combination of materials at 214.

Figure 3A:
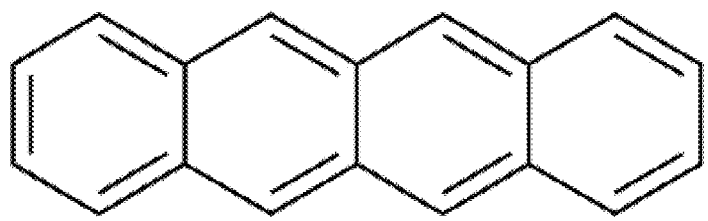
FIG. 3A is a schematic diagram of the chemical structure of tetracene, according to some illustrative embodiments.
Figure 3B:
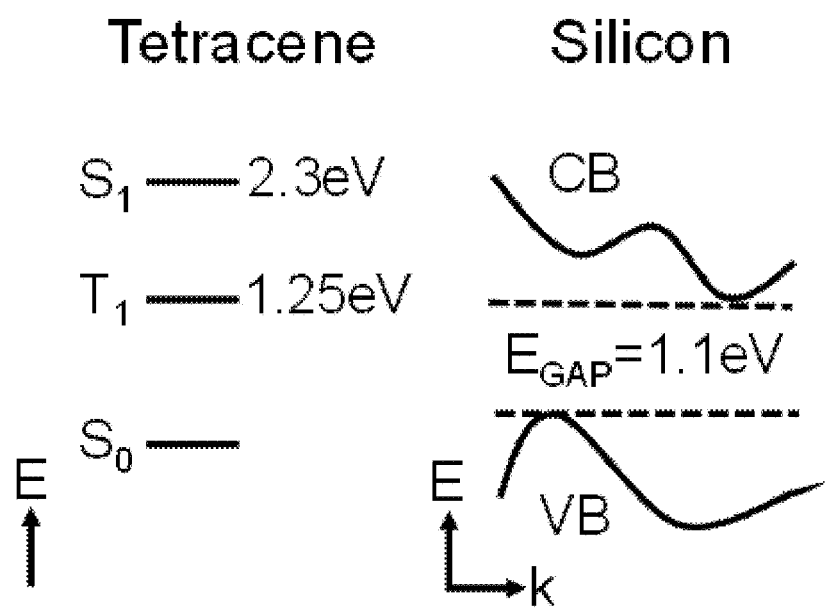
FIG. 3B is a schematic diagram of energy levels in tetracene and silicon, according to some illustrative embodiments.

FIG. 3A depicts a chemical structure of tetracene. FIG. 3B depicts energy levels for singlet ($S_1$) and triplet ($T_1$) excitons in tetracene relative to the ground state ($S_0$). The triplet energy is similar to the indirect gap between the conduction band (CB) and valence band (VB) in silicon.

Figure 3C:
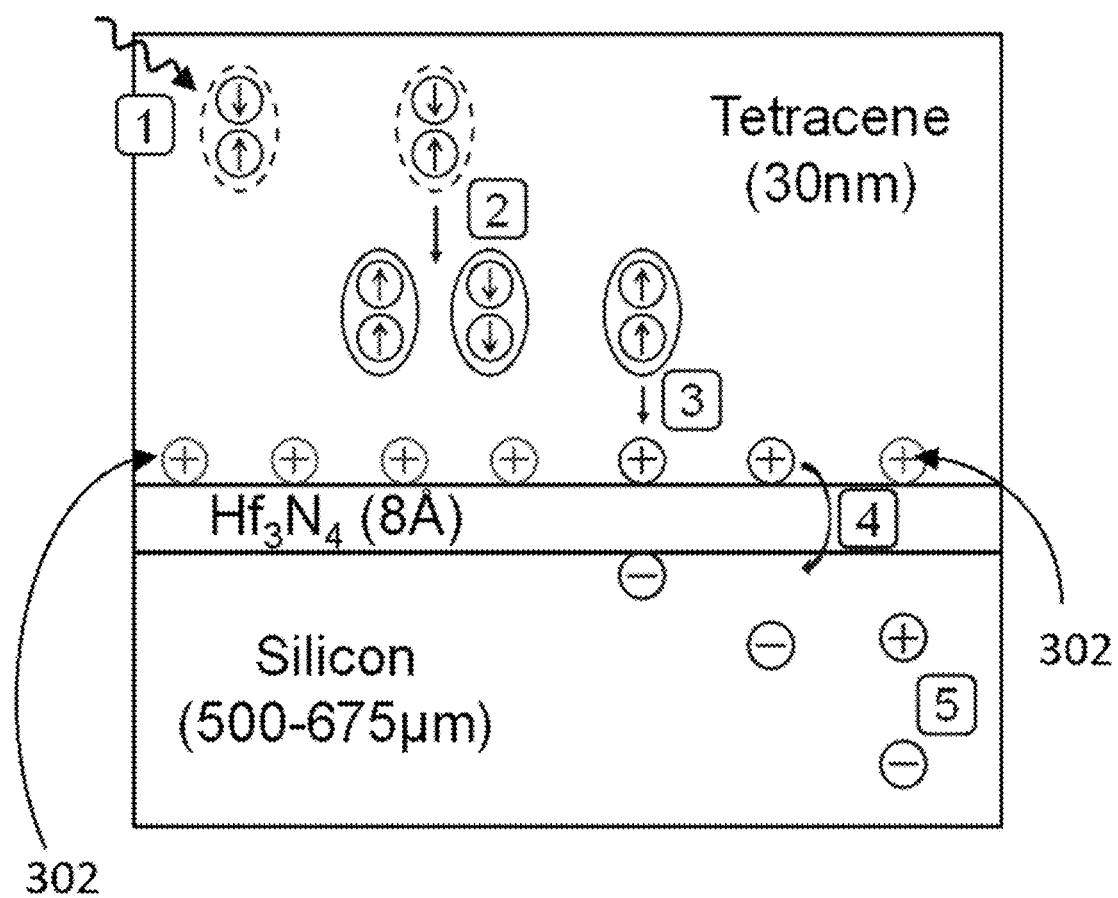
FIG. 3C is a schematic diagram demonstrating processes occurring in a layered system comprising tetracene, hafnium nitride ($Hf_3N_4$), and silicon, according to some illustrative embodiments.

Without wishing to be bound by theory, a proposed mechanism of exciton transfer is shown in FIG. 3C. In this proposed mechanism, a singlet exciton is created upon absorption of a photon in tetracene at 1. The singlet exciton subsequently undergoes fission into two triplet excitons at 2. The triplet excitons are dissociated across the depicted interlayer at 3, which in the figure is depicted as a hafnium nitride interlayer, though a hafnium oxide and/or hafnium oxynitride interlayer could also be used. An electron transfers into silicon and the corresponding hole remains in the tetracene at 4. The charge separation across the interlayer sets up an electric field, which may repel positive charge carriers (holes) from the silicon-interlayer interface. As a result of this electric-field passivation, recombination of charge carriers is greatly reduced. Continuous creation of additional triplet excitons in tetracene (upon continuous exposure to electromagnetic radiation) in combination with the charging effect (also referred to herein as electric-field passivation effect) provides a driving force for the hole from the dissociated exciton to move into silicon as well. The end result is full exciton transfer. One major advantage of this mechanism is that passivation at the silicon-interlayer interface is greatly increased by introducing field-effect passivation via charging. FIG. 3C also shows a proposed presence of residual positive charges 302 at the tetracene/interlayer interface. These carriers may contribute to electric field passivation in silicon.

Figure 8A:
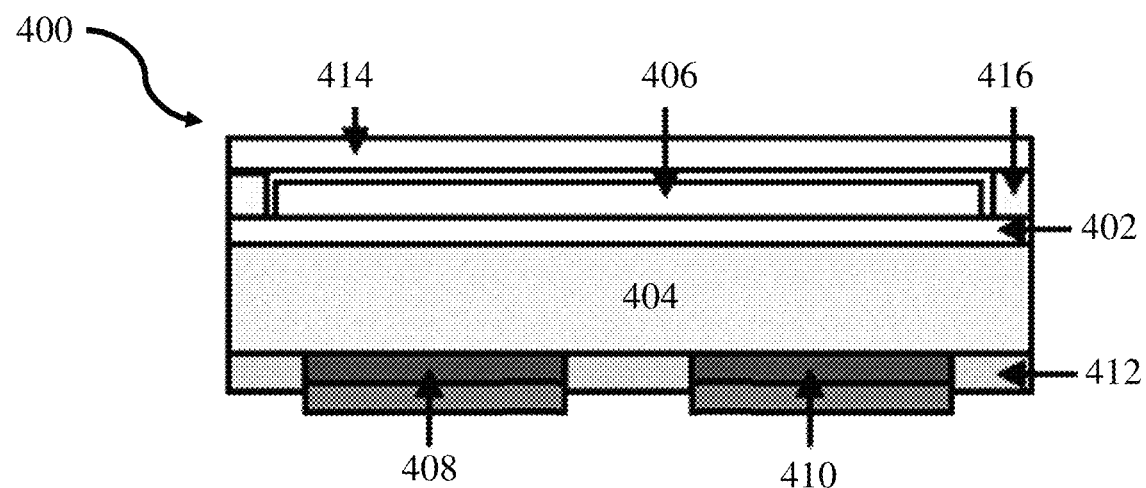
FIG. 8A is a schematic diagram of a solar cell comprising a hafnium oxynitride interlayer, according to some illustrative embodiments.

FIG. 8A is a schematic diagram of a solar cell 400 comprising an interlayer 402, which in the depicted embodiment is a hafnium oxynitride interlayer. However, an interlayer may be made using any of the interlayer compositions described herein including, for example, a transition metal oxide, a transition metal oxynitride, and/or a transition metal nitride. In some embodiments, a solar cell may include a substrate 404 such as an inorganic semiconductor (e.g. n-Si or any other appropriate semiconductor as described herein), and the interlayer may be disposed on the substrate. As described above, a layer 406 including a material that undergoes singlet exciton fission when exposed to electromagnetic radiation, such as a tetracene layer, may be disposed on the interlayer. In some embodiments, the solar cell further comprises one or more contacts electrically connected with (e.g., in direct contact with) the substrate. For example, in certain embodiments, the solar cell comprises one or more electron-selective contacts 408, such as an aluminum/lithium fluoride contact, and one or more hole-selective contacts 410, such as an aluminum/molybdenum oxide contact, though any appropriate type of contact may be used. Further, each contact may be electrically connected with (e.g., in direct contact with) the substrate. In certain embodiments, the one or more electron-selective contacts and the one or more hole-selective contacts form an interdigitated configuration on the substrate, e.g., with the electron-selective contact(s) and the hole-selective contact(s) in an alternating pattern. The configuration of the contacts may be fabricated, e.g., by photolithography. In some embodiments, a dielectric layer 412, such as an alumina ($Al_2O_3$) layer, coats at least a portion of the substrate and is located adjacent to (e.g. directly adjacent to) the contact(s). In certain embodiments, the dielectric layer, coats the substrate between the contacts. In some embodiments, a solar cell may be encapsulated with a transparent layer 414, such as a quartz layer, and/or with an appropriate epoxy or polymer encapsulant 416, one or both of which may be at least partially, and in some embodiments substantially, transparent to electromagnetic radiation with wavelengths corresponding to an absorption range of the solar cell. In the depicted embodiment, the transparent layer is attached to the substrate by the encapsulant which may be a cross-linked polymer, such as a UV-cured epoxy, in such an embodiment. Due to the oxygen and water sensitive properties of the materials included in the disclosed systems, in some embodiments, a volume enclosed between the transparent layer and substrate, interlayer, and/or exciton fission layer may be filled with an inert gas (e.g., Nitrogen ($N_2$), Argon).

EXAMPLE

Sample Fabrication

Silicon wafers used in the experiments described herein were transferred to a clean room, diced and cleaned using standard RCA cleaning. First, organic contaminants were removed by immersing the sample in 5:1:1 of deionized (DI) water, ammonium hydroxide $NH_4OH$ (29% by weight of $NH_3$ in water), and hydrogen peroxide (30% $H_2O_2$) for 20 minutes at 80 degrees Celsius. In a second step the native oxide was removed by etching with 1% aqueous hydrofluoric acid for 60 seconds. Subsequently metallic (ionic) contaminants were removed from the wafer surface in 5:1:1 of DI water, hydrochloric acid HCl (37% by weight in water), and 30% $H_2O_2$ for 20 minutes at 80 degrees Celsius.

After cleaning, a hafnium oxynitride interlayer ($HfO_xN_y$) was deposited using ALD in a Cambridge Nanotech Savannah Deposition System. Tetrakis(dimethylamino)hafnium was used as the hafnium precursor and ammonia was used as the nitrogen precursor. It is believed that the oxygen present in the layer was due to the presence of residual oxygen in the chamber. The hafnium injection pulse duration was 30 ms while the ammonia injection pulse duration was chosen to be 20 ms. The hafnium precursor was at a temperature of 95° C., and the reaction chamber was heated to 150° C. during the growth. The base pressure at a nitrogen flow of 40 $cm^3$ $min^{-1}$ was 0.4 Torr. The samples were immediately transferred into a nitrogen glovebox. Finally, 30 nm of tetracene was deposited at a rate of 1 $Ås^{-1}$ by thermal evaporation in a vacuum chamber (base pressure<$1×10^{-6}$ Torr) directly connected to the glovebox. The tetracene used in this work was received from Sigma Aldrich (98% purity) and purified by sublimation in a tube furnace three consecutive times.

EXAMPLE

Solar Cell Fabrication

Silicon wafers were prepared as detailed above. Using photolithography, electron selective contacts (aluminum/lithium fluoride) and hole selective contacts (aluminum/molybdenum oxide) were fabricated on the silicon wafers in an interdigitated fashion. Then the wafers were diced into chips and the back side of individual chips was protected using PDMS to provide a seal for a second piece of encapsulating silicon. It was experimentally verified that a full RCA clean prior to $HfO_xN_y$ deposition was not compatible with this solar cell fabrication since the protective rear PDMS seal decomposed in the presence of acids. The monomers subsequently reattached to the front side by condensation. Consequently, to minimize contamination by PDMS, the front side was cleaned using 10% aqueous HF for 1 min and a 5:1:1 ratio of deionized (DI) water, aqueous ammonium hydroxide (29% $NH_3$), and aqueous hydrogen peroxide (30% $H_2O_2$) for 20 min at 60° C. Subsequently the encapsulating silicon protecting the back contacts was peeled off and the downconversion front side including a hafnium oxynitride interlayer was fabricated as detailed above.

After forming the desired layered structure, samples were enclosed in a pure nitrogen glovebox using UV-curing epoxy and a quartz slide to enclose the samples. Care was taken to shadow the active area of the substrates with aluminum foil during UV exposure. A schematic of the final device construction is shown in FIG. 8A as described above.

EXAMPLE

Sample Physical Characterization

The atomic concentrations of the elements for the interlayer deposited using the methods described above were determined to be 57% hafnium, 22% nitrogen and 21% oxygen from X-Ray Photoelectron Spectroscopy (XPS). The bandgap was measured by Ultraviolet Photoelectron Spectroscopy (UPS) and Inverse Photoemission Spectroscopy (IPES) to be 4.28 eV. Atomic force microscopy (AFM) yielded a root mean square roughness of 150 pm. The overall structure was Si/$HfO_xN_y$/tetracene, where tetracene was thermally evaporated. A high-performing thickness of $HfO_xN_y$ was determined to be 0.8 nm, as discussed further herein. The tetracene thickness was kept constant at 30 nm.

Photoelectron Spectroscopy: ultraviolet photoelectron spectroscopy (UPS), X-ray photoelectron spectroscopy (XPS), and inverse photoemission spectroscopy (IPES) experiments were conducted in an ultra-high vacuum chamber (UHV) with a base pressure of $5\times10^{-10}$ Torr. UPS measurements were done with both the He I (21.22 eV) and He II (40.81 eV) photon lines generated by a discharge lamp. Non-monochromated aluminum-K(alpha) X-rays with an energy of 1486.6 eV were used for all XPS measurements. IPES was performed in the isochromat mode, with a setup described in Wu et al. (Wu, C. I., Hirose, Y., Sirringhaus, H. & Kahn, A. Electron-hole interaction energy in the organic molecular semiconductor PTCDA. *Chemical Physics Letters* 272, 43-47 (1997)). The nominal energy resolutions for UPS, XPS, and IPES were 100 meV, 800 meV, and 400 meV, respectively. The tetracene layers were deposited on $HfO_xN_y$/Si surfaces by thermal evaporation at rates of about 1 Å$s^{-1}$, in a UHV chamber connected to the analysis chamber.

EXAMPLE

Sample Performance Characterization and Optimization

Silicon photoluminescence experiments were conducted to determine the presence of triplet exciton transfer in a Tetracene/(Hafnium Oxynitride)/Si system (also referred to herein as a silicon/(hafnium oxynitride)/tetracene system) and its mechanism. The system demonstrated an organic/inorganic interface that coupled excitonic properties of molecular materials (e.g., tetracene) to silicon and silicon's indirect band gap, which may be applied to solar cells to increase external quantum efficiencies above 100% and to increase power efficiencies beyond the single junction limit. Triplet exciton transfer to silicon (an example of an inorganic semiconductor) after singlet exciton fission in tetracene (and example of a material that undergoes singlet fission when exposed to electromagnetic irradiation) was supported. The energy transfer process may have been mediated by interfacial charge separation that contributed to electric field effect passivation of the silicon surface. An insulating interlayer was an atomic layer deposited hafnium oxynitride layer, though a hafnium oxide or hafnium nitride layer could have been used, which interlayer may have been responsible for additional chemical passivation. While silicon was not particularly bright due to its indirect bandgap, its photoluminescence was sufficient to investigate energy transfer phenomena and model the likely dynamics in a full solar cell. Due to a lack of electrical contacts, charge carriers were not extracted in samples. Instead, charge carriers were allowed to radiatively recombine. Given the slow radiative rates in silicon, it was reasonable to hypothesize that these charge carriers would be able to reach the contacts in a completed solar cell.

Figure 4:
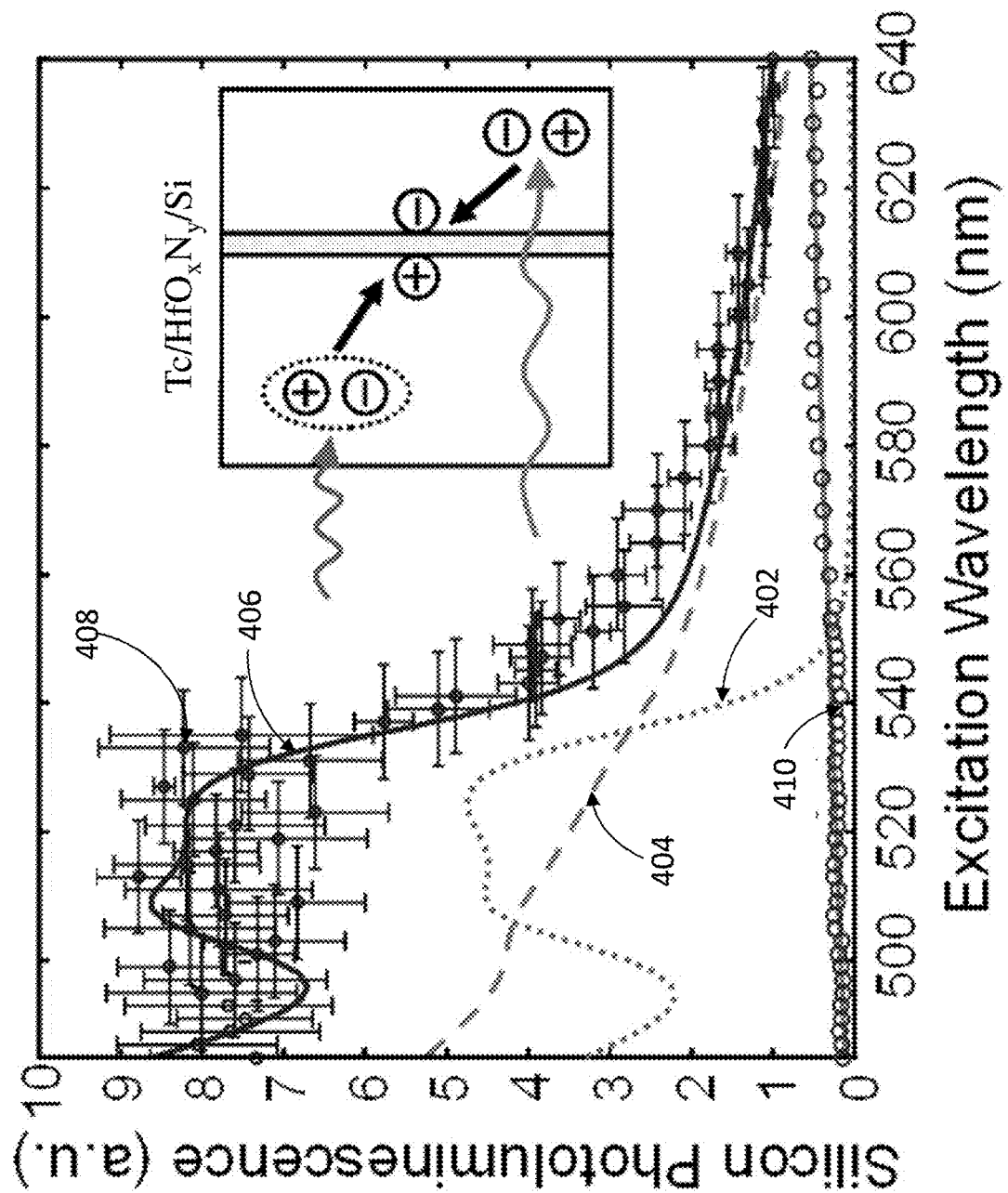
FIG. 4 is a plot of an excitation spectrum for a silicon/(hafnium oxynitride) system, according to some illustrative embodiments.

In FIG. 4, a sample was excited without tetracene (silicon/(hafnium oxynitride)), and a different sample with tetracene (silicon/(hafnium oxynitride)/tetracene) was excited, using a variable wavelength excitation source. Photoluminescence spectra were recorded in the near infrared (wavelength between or equal to 837 nm and 1642 nm: λ=837 nm-1642 nm). The figure depicts plots of the photoluminescence (PL) spectrum for silicon/(hafnium oxynitride) and silicon/(hafnium oxynitride)/tetracene. The silicon/(hafnium oxynitride) circles 410 show a PL of a sample without a tetracene layer, fitted by a solid line. The silicon/(hafnium oxynitride)/tetracene dots 408 show a PL of a sample with tetracene. Dotted line 402 shows a modelled contribution of tetracene absorption to energy transfer and electric field effect passivation. Dashed line 404 shows a contribution of silicon absorption to electric field effect passivation. Solid line 406 shows a modelled PL spectrum for silicon/(hafnium oxynitride)/tetracene. The inset in FIG. 4 depicts a schematic of two possible causes of electric field effect passivation.

To further investigate the passivation properties of Si/$HfO_xN_y$/tetracene, quasi-steady state photoconductance (QSSPC) decay measurements were performed. To measure surface recombination velocity (SRV), photoconductance decay measurements were performed using the silicon lifetime and wafer metrology system WCT-120 from Sinton Instruments (fully compliant with SEMI standard PV-13). The optical constants were calculated considering reflection and absorption of all layers on top of silicon. Where applicable, the transfer matrix method was used. The measured effective lifetimes were then used to determine the SRVs. For an intrinsic silicon wafer passivated by 0.8-nm-thick layers of $HfO_xN_y$ on both sides, the surface recombination velocity (SRV) was (971±40) cm/s with an effective lifetime of (15±1) μs. With tetracene on the front surface, the effective lifetime increased to (27±1) μs, which corresponded to an SRV of (534±39) cm/s. After illumination with λ=460 nm light at 20 mW/cm$^2$ for 60 s, the SRV decreased to (173±34) cm/s with an effective lifetime of (55±2) μs. It was concluded that charge generation at the Si/$HfO_xN_y$/tetracene interface may have provided electric field effect passivation and could be initiated by optically pumping tetracene or silicon. The same phenomena were observed in the solar cell excitation spectra. Indeed, the ratio of the photocurrent in the 8-Å-thick and 16-Å-thick $HfO_xN_y$ cells consisted of equal contributions from tetracene and silicon, substantially identical to the PL enhancement. This finding supported that the PL excitation spectrum may have reported on the same interfacial processes as the device.

Referring again to FIG. 4, the excitation spectrum of the sample with the tetracene layer is compared with the sample without tetracene. Specifically, the observed silicon PL was stronger at all wavelengths, increasing about 8-fold in the tetracene absorption region at λ<550 nm when compared to the value at λ=640 nm excitation. Singlet exciton fission can effectively split incoming photons in two, potentially doubling the photocurrent in solar cells generated from short wavelength light. Since singlet fission may be capable of at most a 2-fold enhancement, the data suggested an improvement in surface passivation during illumination of tetracene. The behavior was reversible when the wavelength was swept back and forth (not shown), hence it was not a permanent change, by contrast to what one would expect in case of a modification of chemical passivation. This behavior may be explained by electric field passivation provided by a charge separation across the interlayer disposed between tetracene and silicon. A hafnium oxynitride interlayer (an example of a transition metal nitride interlayer) disposed between tetracene and silicon provided chemical passivation, and triplet exciton transfer may have proceeded via an initial charge separation that provided additional electric field passivation. Charge could be generated either by transferring an electron from a tetracene exciton into the conduction band of silicon, or by exciting silicon and transferring a hole from the valence band of silicon to the highest occupied molecular orbital (HOMO) of tetracene. Note that charge separation should not yield negatively charged tetracene given the high lowest unoccupied molecular orbital LUMO=2.4 eV of tetracene. The excitation spectrum for electron transfer from tetracene is proportional to the absorption spectrum of tetracene. Indeed, the absorption edge of tetracene at λ=550 nm is clearly visible in FIG. 4. Similarly, the excitation spectrum for hole transfer from silicon is proportional to the absorption coefficient of silicon with more charge carrier pairs generated close to the interface for shorter wavelengths. This trend was also observed in the data. Interfacial charge separation after excitation of Si or tetracene suggested that the energy difference between the tetracene HOMO and the Si conduction band was roughly isoenergetic with both the triplet exciton in tetracene (1.25 eV) and the bandgap of Si (1.11 eV).

Figure 5A:
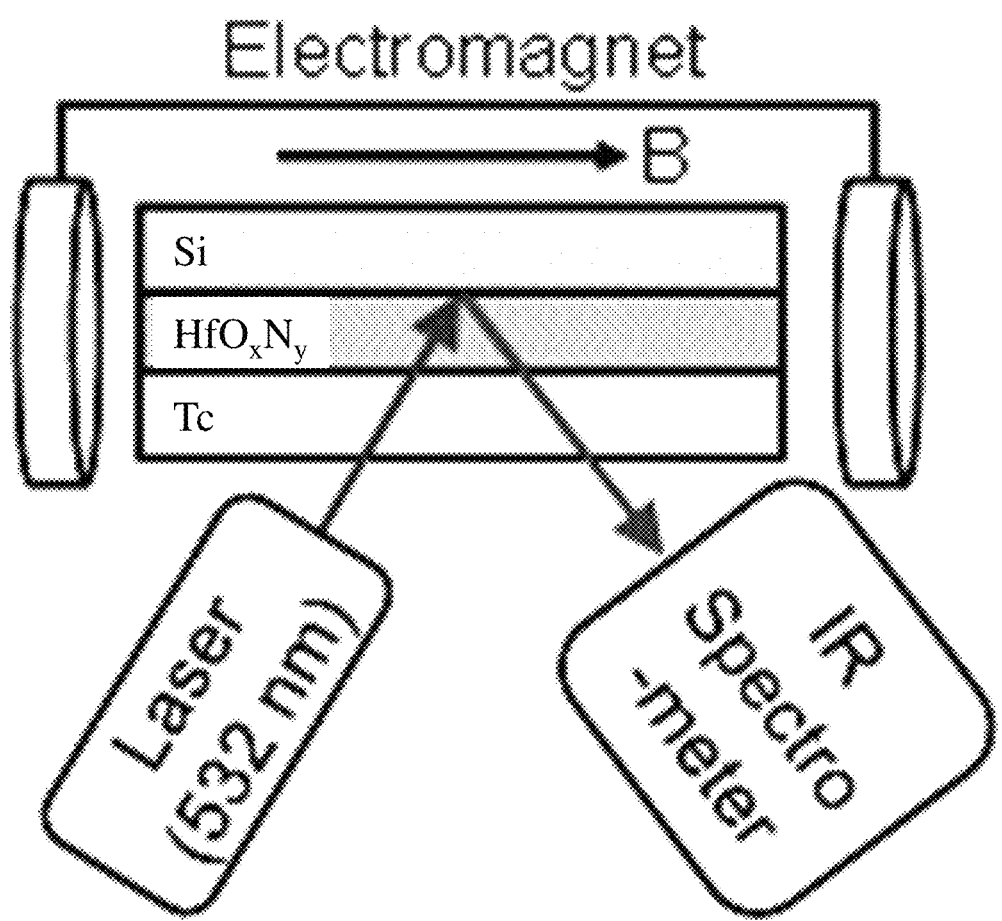
FIG. 5A is a schematic diagram of an apparatus for magnetic field effect measurement for a silicon/(hafnium oxynitride)/tetracene system, according to some illustrative embodiments.
Figure 5B:
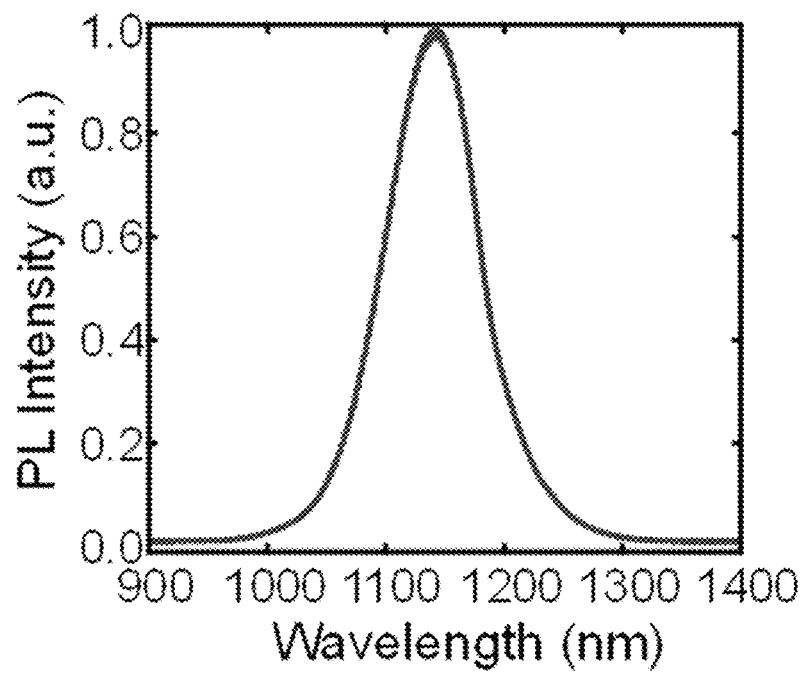
FIG. 5B is a plot of a photoluminescence spectrum of silicon for a silicon/(hafnium oxynitride)/tetracene system, according to some illustrative embodiments.
Figure 5C:
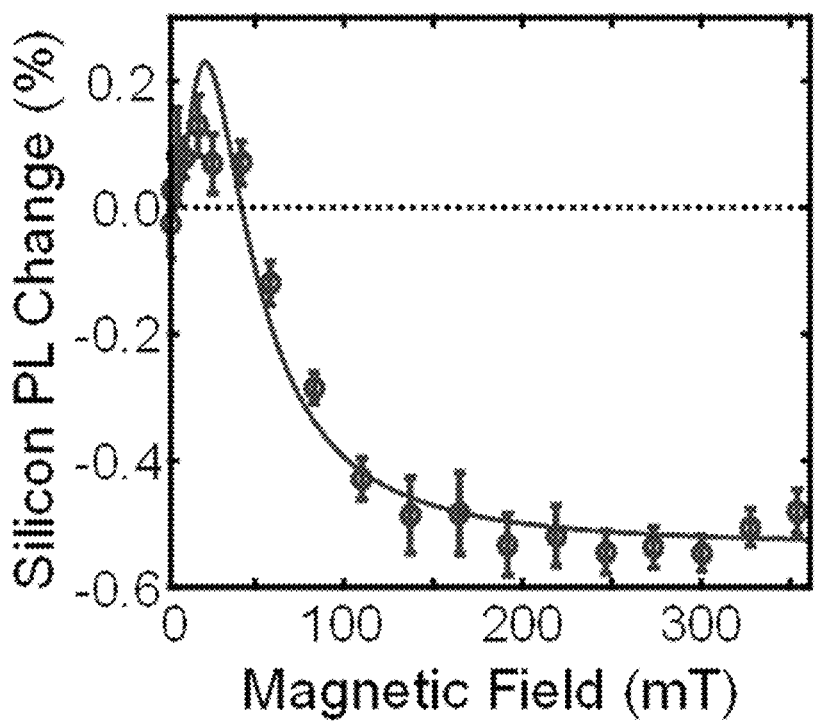
FIG. 5C is a plot of photoluminescence (PL) change of silicon in response to external magnetic field for a silicon/(hafnium oxynitride)/tetracene system, according to some illustrative embodiments.

To distinguish between singlet and triplet excitons as the origin of electron transfer from tetracene, is should be noted that the singlet fission rate of tetracene can be manipulated by applying external magnetic fields. FIG. 5A-5C depict magnetic field effect measurements for a silicon/(hafnium oxynitride)/tetracene system. As detailed further below, FIG. 5A depicts an experimental setup used to perform the measurements. FIG. 5B depicts spectrum of band-to-band photoluminescent transition in silicon for a silicon/(hafnium oxynitride)/tetracene system. FIG. 5C depicts magnetic field effects on silicon PL, following modelled and scaled fission rate behavior.

It was verified that photoluminescence (PL) showed emission from a silicon band-to-band transition, peaking at wavelength λ=1144 nm. Integrating the silicon PL yielded the excitation spectra in FIG. 5B. The silicon PL intensity of the sample without tetracene was shown to increase with increasing wavelength. This trend as a function of wavelength was characteristic of surface recombination losses in silicon and may be explained by a decreasing absorption coefficient of silicon at longer wavelengths. This gave the charge carriers generated by longer wavelength light more time to recombine radiatively before they could reach the interface.

As shown in FIG. 5A, with the sample placed in an electromagnet, a silicon/(hafnium oxynitride)/tetracene system was excited monochromatically at λ=532 nm. Around 50% of the absorbed light was absorbed by tetracene and the remainder by the underlying silicon. The silicon spectra were recorded in response to an external magnetic field (e.g., FIG. 5C). Specifically, for small magnetic fields, the singlet fission rate first increases, then decreases and plateaus, yielding a characteristic magnetic field dependence. Thus, it was found that the silicon PL could indeed be modulated by external magnetic fields, which agrees well with the shape of the fission rate. Specifically, at high magnetic fields, the fission rate was decreased, resulting in fewer triplet excitons. A corresponding decrease in the silicon photoluminescence was observed, demonstrating that triplet excitons were likely dominantly responsible for donating electrons at the silicon interface.

Figure 6:
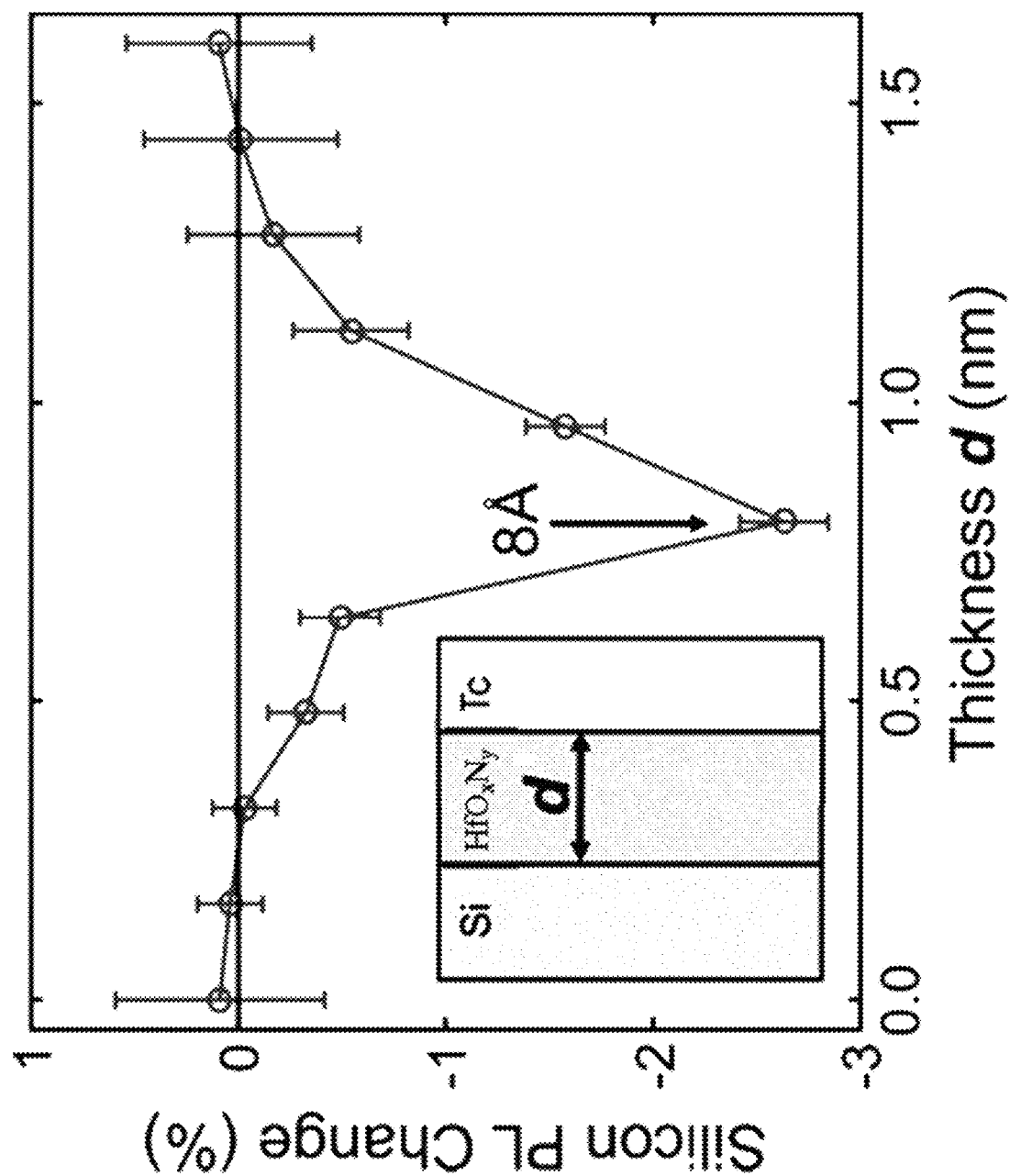
FIG. 6 is a plot of silicon photoluminescence change with thickness of a hafnium oxynitride interlayer in a silicon/(hafnium oxynitride)/tetracene system, according to some illustrative embodiments.

The above experiment was repeated for several hafnium oxynitride interlayer thicknesses, ranging from zero (0) nanometers (nm) to 1.6 nm at a resolution of 0.16 nm, where every data point corresponds to one additional ALD cycle (FIG. 6). FIG. 6 depicts a thickness dependence of magnetic field induced silicon PL change in a silicon/(hafnium oxynitride)/tetracene system. The magnetic field effect exhibited a minimum at a thickness of 0.8 nm (5 ALD cycles). For interlayers thinner than 0.8 nm, the magnetic field effect magnitude decreased towards zero with decreasing interlayer thickness. This behavior may be attributed to a lack of chemical passivation. For interlayers thicker than 0.8 nm, the magnetic field effect decreased as well. This behavior may be attributed to the tunneling probability for interlayers decreasing exponentially with increasing interlayer thicknesses.

From these experiments it was not possible to resolve the presence of triplet exciton transfer given the large electric field passivation effect also originating from triplet excitons. Both phenomena increased the photoluminescence from silicon and exhibited a negative magnetic field effect. In order to be able to quantify the contributions of electric field passivation and possible exciton transfer, a second excitation beam at λ=785 nm (also referred to herein as the red pump or the second pump) was introduced in addition to the excitation beam at λ=532 nm (also referred to herein as the green pump). The photon flux ratio of the two pumps was at least $\Phi_{785\ nm}:\Phi_{532\ nm}$ 3.7:1 in case of the doped wafers. This value amounted to 0.7 for the intrinsic wafer. Since tetracene does not absorb light at an excitation of λ=785 nm, the second pump was sensitive to the electric field passivation effect initiated by the green pump. A model was developed to quantify the exciton yields, defined as number of excitons fully transferred into silicon divided by number of singlet excitons created in tetracene. In addition to previously described experiments, the magnetic field effect of the photoluminescence of tetracene was also recorded. Given the fission rate, its magnetic field dependence and the radiative rate of tetracene, the rate of singlet transfer (based on the quenching of the tetracene fluorescence magnetic field effect) were calculated. The nonradiative rates and the rate of triplet exciton transfer were then obtained from fitting the data to the results of the monochromatic and bichromatic magnetic field effects.

This experiment was repeated for a series of silicon wafers with varying dopant type and level. Doping the wafers changed their Fermi level, facilitating a change in the energy alignment across the interlayer and facilitating investigation of the effects of energy alignment on exciton transfer. As shown in FIG. 7B, the magnetic field effect of the monochromatic and bichromatic excitation coincided for p-doped and intrinsic wafers. For n-doped wafers, a spread between the two experiments was observed. This indicated that exciton transfer from tetracene (an example of a material that undergoes singlet fission upon exposure to electromagnetic radiation) to silicon (an example of an inorganic semiconductor) may have been present in the samples including n-doped silicon but not in samples including p-doped or intrinsic silicon. In samples including n-type silicon (also referred to herein as n-doped silicon), an intermediate state may have been stabilized during Fermi level alignment, suggesting that the charge-separated state was approximately isoenergetic with the triplet exciton. A peak total exciton yield of 133% was obtained, as detected by a magnetic field dependence of silicon photoluminescence and supported by optical excitation spectra, which may have been composed of a singlet yield of 56% and a triplet yield of 76%.

Figure 7A:
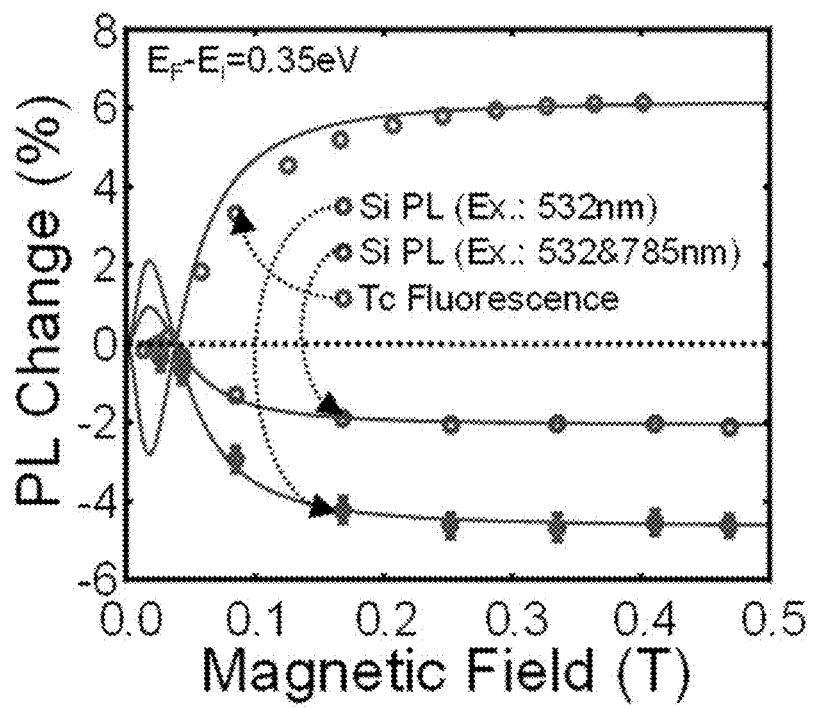
FIG. 7A is a plot of silicon photoluminescence change and tetracene fluorescence change with magnetic field in a silicon/(hafnium oxynitride)/tetracene system, according to some illustrative embodiments.
Figure 7B:
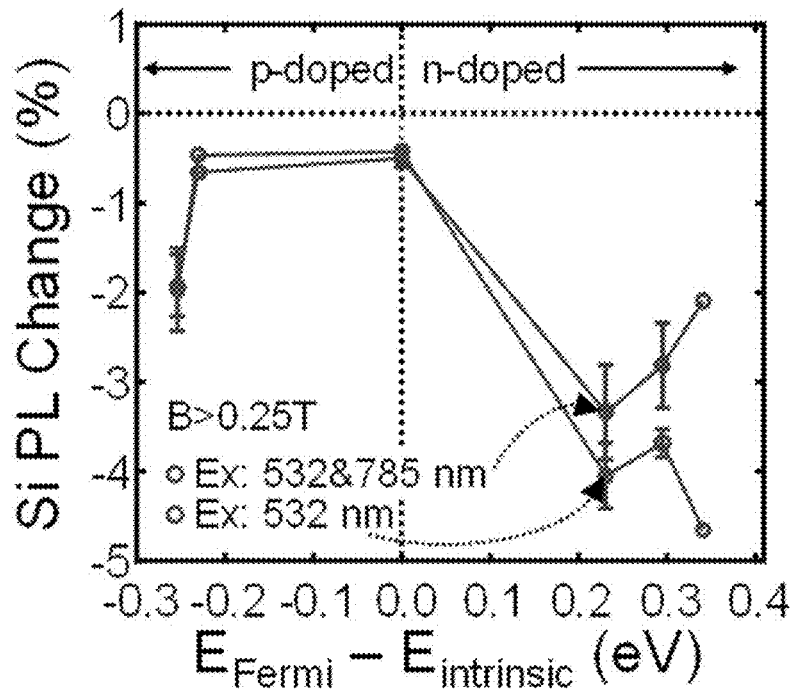
FIG. 7B is a plot of magnetic field effect mean values of silicon photoluminescence change in a silicon/(hafnium oxynitride)/tetracene system for silicon wafers having different doping levels, according to some illustrative embodiments.
Figure 7C:
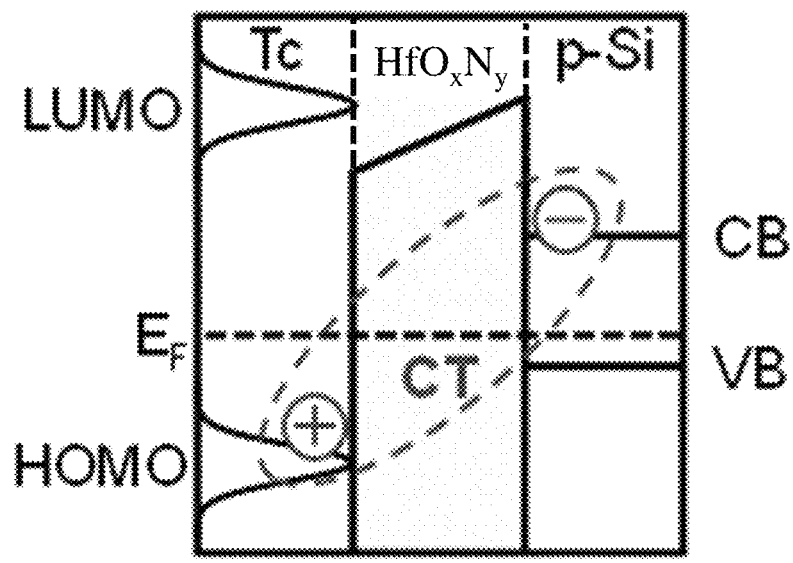
FIG. 7C is a schematic diagram of a proposed energy level alignment for p-type silicon wafers in a silicon/(hafnium oxynitride)/tetracene system, according to some illustrative embodiments.
Figure 7D:
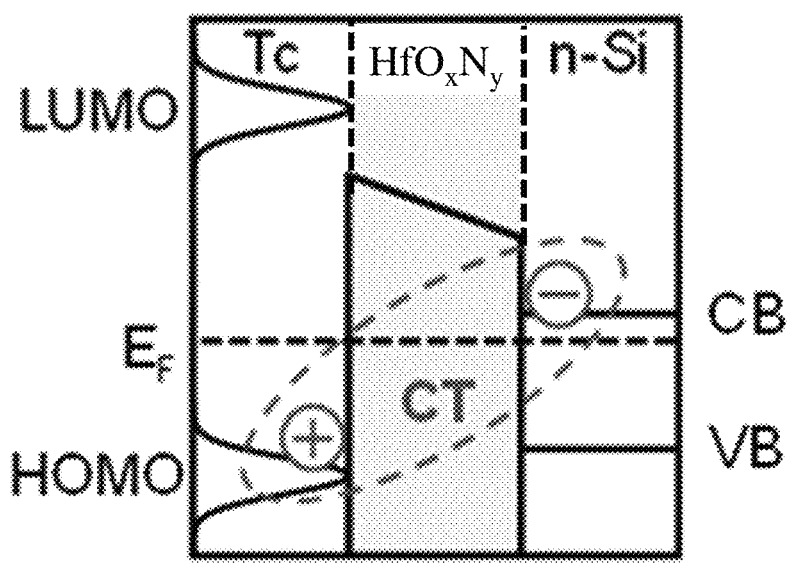
FIG. 7D is a schematic diagram of a proposed energy level alignment for n-type silicon wafers in a silicon/(hafnium oxynitride)/tetracene system, according to some illustrative embodiments.

FIG. 7A-7D illustrate the separate contributions of field effect passivation and exciton transfer. FIG. 7A depicts magnetic field effects on tetracene fluorescence and silicon PL when a silicon/(hafnium oxynitride)/tetracene system is excited monochromatically at λ=532 nm and bichromatically at λ=532 nm and λ=785 nm, at a photon flux ratio of at least $\Phi_{785\ nm}:\Phi_{532\ nm}$ 3.7:1 in case of the doped wafers. This value amounted to 0.7 for the intrinsic wafer. FIG. 7B illustrates magnetic field effect mean values (B>0.25 T) in a silicon/(hafnium oxynitride)/tetracene system for silicon wafers of different doping levels in a silicon/(hafnium oxynitride)/tetracene system, for both monochromatic and bichromatic excitation. FIG. 7C depicts a proposed energy level alignment for p-type silicon wafers in a silicon/(hafnium oxynitride)/tetracene system. FIG. 7D illustrates a proposed energy level alignment for n-type silicon wafers in a silicon/(hafnium oxynitride)/tetracene system. Relative energy level alignments are not necessarily depicted to scale.

These results provide non-limiting embodiments herein of a bifunctional passivation layer capable of simultaneously minimizing surface recombination losses and coupling to external excited states, a technology of likely importance to solar cells operating beyond the single junction efficiency limit.

Note that by contrast, no doping dependence would have been expected if energy transfer occurred via simultaneous transfer of the electron and hole. Rather, the observed doping dependence may indicate triplet energy transfer mediated by an initial charge separation. To mediate the energy transfer, it may be advantageous for the charge-separated state to have energy between the triplet exciton (1.25 eV) and the bandgap of Si (1.11 eV). In n-doped wafers, the Fermi level is close to the conduction band of the silicon. At equilibrium, n-doping should bring the conduction band of silicon closer to the HOMO energy of tetracene, resulting in a lower energy charge-separated state.

EXAMPLE

Solar Cell Performance

Figure 8B:
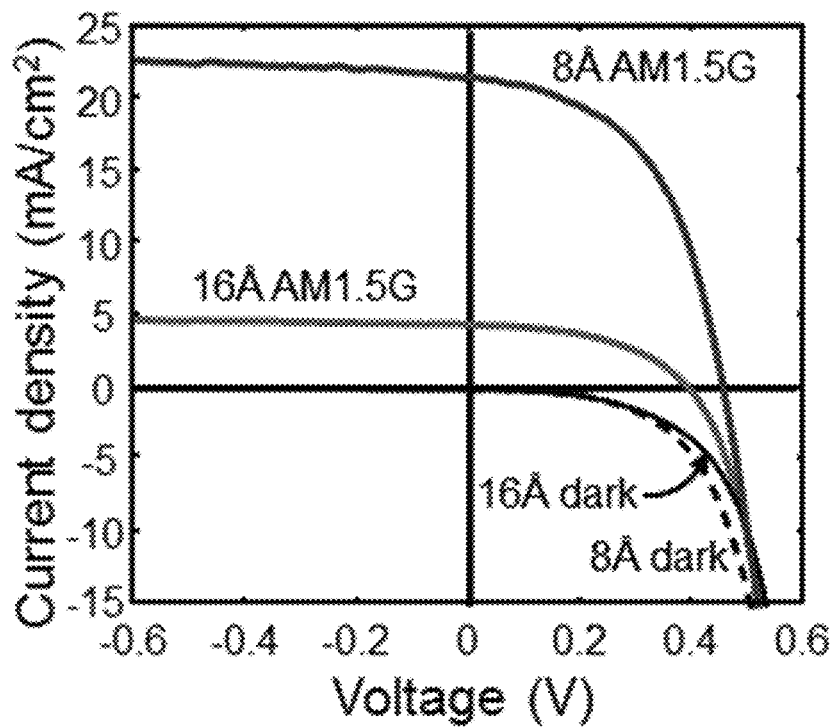
FIG. 8B is a plot of current density vs. voltage for solar cells having an interlayer thickness of either 8 Å or 16 Å, according to some illustrative embodiments.
Figure 8C:
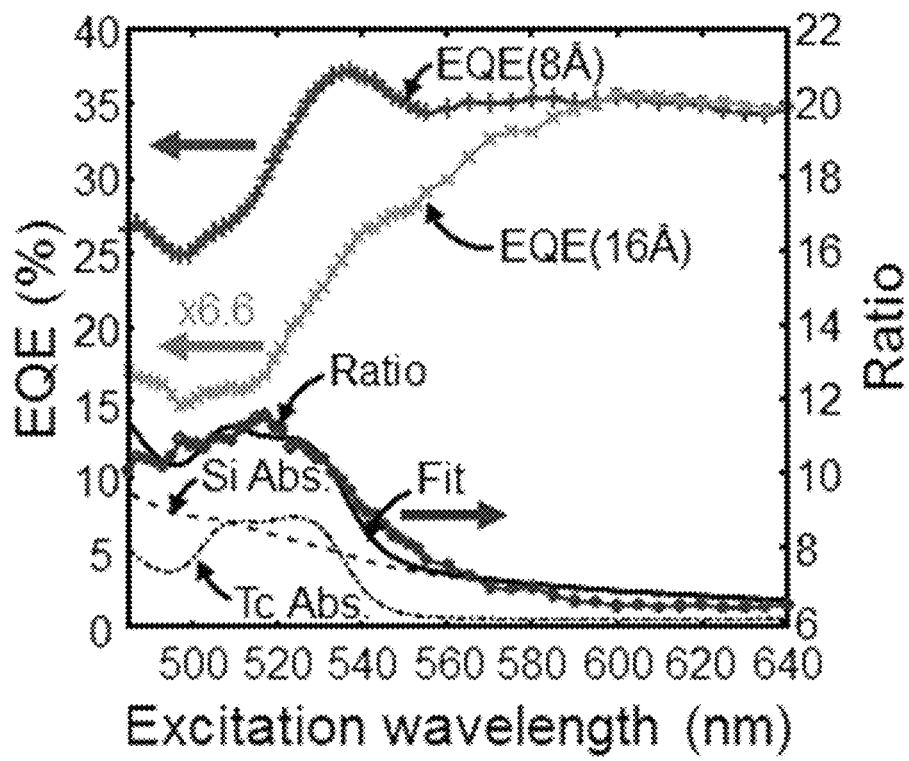
FIG. 8C is a plot of external quantum efficiency (EQE), and a ratio of EQEs, vs. excitation wavelength of solar cells having an interlayer thickness of either 8 Å or 16 Å, according to some illustrative embodiments.

Photovoltaic cells were manufactured as detailed above with structures similar to that shown in FIG. 8A using an n-doped silicon substrate, a hafnium oxynitride interlayer, and a tetracene layer disposed on the interlayer within the solar cell constructions. FIGS. 8B and 8C depict photocurrent experiments for the manufactured solar cells. For the depicted experiments, current-voltage characteristics were recorded using a precision semiconductor parameter analyzer (Agilent 4156C) in voltage mode sweeping from −0.6V to 0.6V in 10 mV intervals. The sample was illuminated through a shadow mask using a calibrated solar simulator (Newport 69920) emitting an AM1.5G solar spectrum. The EQE data was collected using a broadband tunable laser (SuperK EXTREME supercontinuum) or a tungsten lamp with monochromator as excitation source under white light bias.

FIG. 8B shows current-voltage characteristics for solar cells with interlayer thicknesses of 8 Å and 16 Å. FIG. 8C shows external quantum efficiency (EQE) spectra of solar cells with interlayer thicknesses of 8 Å and 16 Å. The EQE of the 16-Å-thick $HfO_xN_y$ cell was scaled by ×6.6 for comparison. The ratio of the EQE of the 8-Å-thick $HfO_xN_y$ cell and the 16-Å-thick $HfO_xN_y$ cell is shown in the curve with circles and compared to a fit (solid line without markers) using contributions of silicon absorption (dashed line) and tetracene absorption (dash-dotted line).Cells with 8-Å-thick $HfO_xN_y$ interlayers were compared to cells with 16-Å-thick $HfO_xN_y$ interlayers. In these two devices, the optical properties were close to identical, but the thicker interlayer was hypothesized to retard charge and exciton tunneling between tetracene and silicon, allowing isolation of the effects that stem from coupling at the interface.

The current-voltage characteristics of the solar cells under AM1.5G illumination conditions are shown in FIG. 8B. The device based on the 16-Å-thick interlayer exhibited a short circuit current $I_{SC}$=4.6 mAcm$^{-2}$, open circuit voltage $V_{OC}$=0.40 V, a fill factor FF=48% and a power conversion efficiency PCE=0.9%. In contrast, the device based on the 8-Å-thick interlayer showed $I_{SC}$=21.7 mAcm$^{-2}$, $V_{OC}$=0.46V, FF=51%, and PCE=5.1%. This constituted a 5-fold increase in $I_{SC}$ and an almost sixfold increase in PCE due to the superior external quantum efficiency (EQE) of the 8-Å-thick $HfO_xN_y$ device as shown in FIG. 8C. Under a white light bias, the EQE for the 8-Å-thick $HfO_xN_y$ cell was higher than the respective EQE of the 16-Å-thick $HfO_xN_y$ cell by a factor of 6.6 at wavelengths longer than λ=560 nm. The thinner interlayer performed even better in the blue part of the spectrum, peaking at an improvement of 11.6 times at λ=517 nm, which was close to the tetracene absorption maximum at λ=524 nm. Indeed, the shape of the relative improvement roughly matched the absorption of tetracene, but with notable broadening at longer wavelengths. The shape was analyzed and compared to the photoluminescence excitation spectrum.

Without wishing to be bound by theory, two possible causes for the increase in solar cell performance observed for thin $HfO_xN_y$ interlayers were considered. First, exciton dissociation at the interface between tetracene and Si may potentially cause charging of the interface and thus electric field-effect passivation. Such charging could be initiated by photoexcitation of tetracene or silicon. Second, singlet fission in tetracene and subsequent triplet energy transfer could enhance the Si photocurrent.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art. Accordingly, the foregoing description and drawings are by way of example only.

What is claimed is:

1. A system for exciton transfer comprising:
   a substrate comprising an inorganic semiconductor;
   a transition metal nitride interlayer disposed on the substrate;
   an electron selective contact electrically connected to and disposed on a first surface of the substrate;
   a hole selective contact electrically connected to and disposed on the first surface of the substrate; and
   a layer disposed on the transition metal nitride interlayer, wherein the layer comprises a material that undergoes singlet exciton fission when exposed to electromagnetic radiation, wherein the transition metal nitride interlayer is disposed between the substrate and the layer.

2. The system of claim 1, wherein the inorganic semiconductor is silicon.

3. The system of claim 2, wherein the inorganic semiconductor is n-doped silicon.

4. The system of claim 1, wherein the transition metal nitride interlayer comprises a hafnium nitride.

5. The system of claim 4, wherein the hafnium nitride has the chemical formula $Hf_3N_4$.

6. The system of claim 1, wherein the layer comprises tetracene, a tetracene derivative, anthracene, anthracene derivatives, or a combination thereof.

7. The system of claim 1, wherein the transition metal nitride interlayer has a thickness of less than 10 Angstroms.

8. A system for exciton transfer comprising:
   a substrate comprising an inorganic semiconductor;
   an interlayer, comprising a transition metal nitride, a transition metal oxide, and/or a transition metal oxynitride disposed on the substrate;

an electron selective contact electrically connected to and disposed on a first surface of the substrate;

a hole selective contact electrically connected to and disposed on the first surface of the substrate; and a layer disposed on the interlayer, wherein the layer comprises a material that undergoes singlet exciton fission when exposed to electromagnetic radiation, wherein the interlayer is disposed between the substrate and the layer.

9. The system of claim 8, wherein the transition metal nitride comprises hafnium.

10. The system of claim 9, wherein the interlayer comprises hafnium oxide.

11. The system of claim 9, wherein the interlayer comprises hafnium oxynitride.

12. The system of claim 8, wherein the inorganic semiconductor is silicon.

13. The system of claim 12, wherein the inorganic semiconductor is n-doped silicon.

14. The system of claim 8, wherein the layer comprises tetracene, a tetracene derivative, anthracene, anthracene derivatives, or a combination thereof.

15. The system of claim 8, wherein the interlayer has a thickness of less than 10 Å.

16. A system for exciton transfer comprising:

a substrate comprising an inorganic semiconductor;

an interlayer, comprising a transition metal and nitrogen;

an electron selective contact electrically connected to and disposed on a first surface of the substrate;

a hole selective contact electrically connected to and disposed on the first surface of the substrate; and a layer disposed on the interlayer, wherein the layer comprises a material that undergoes singlet exciton fission when exposed to electromagnetic radiation, wherein the interlayer is disposed between the substrate and the layer.

17. The system of claim 16, wherein the transition metal is hafnium.

18. The system of claim 16, wherein the interlayer comprises a transition metal nitride.

19. The system of claim 16, wherein the interlayer comprises a transition metal oxynitride.

20. The system of claim 18, wherein the interlayer further comprises a transition metal oxide.

21. The system of claim 16, wherein the inorganic semiconductor is silicon.

22. The system of claim 16, wherein the interlayer further comprises hafnium oxide.

23. The system of claim 16, wherein the interlayer further comprises hafnium oxynitride.

24. The system of claim 16, wherein the layer comprises tetracene, a tetracene derivative, anthracene, anthracene derivatives, or a combination thereof.

25. The system of claim 16, wherein the interlayer has a thickness of less than 10 Å.

26. The system of claim 8, wherein the interlayer comprises the transition metal nitride.

27. The system of claim 8, wherein the interlayer comprises the transition metal oxide.

28. The system of claim 8, wherein the interlayer comprises the transition metal oxynitride.

29. The system of claim 1, wherein the transition metal nitride interlayer further comprises a transition metal oxide.

30. The system of claim 1, wherein the transition metal nitride interlayer further comprises a transition metal oxynitride.

31. The system of claim 1, wherein the system is configured to generate photocurrent when exposed to the electromagnetic radiation.

32. The system of claim 8, wherein the system is configured to generate photocurrent when exposed to the electromagnetic radiation.

33. The system of claim 16, wherein the system is configured to generate photocurrent when exposed to the electromagnetic radiation.

34. The system of claim 1, wherein the transition metal nitride interlayer is disposed directly against the substrate and the layer.

35. The system of claim 8, wherein the interlayer is disposed directly against the substrate and the layer.

36. The system of claim 16, wherein the interlayer is disposed directly against the substrate and the layer.

* * * * *